United States Patent [19]

Ham et al.

[11] Patent Number: 5,681,763

[45] Date of Patent: Oct. 28, 1997

[54] METHOD FOR MAKING BIPOLAR TRANSISTORS HAVING INDIUM DOPED BASE

[75] Inventors: Thomas Edward Ham, Kissimmee; Isik C. Kizilyalli, Orlando, both of Fla.

[73] Assignee: Lucent Technologies Inc., Murray Hill, N.J.

[21] Appl. No.: 581,665

[22] Filed: Dec. 29, 1995

[51] Int. Cl.[6] .................................................. H01L 21/265
[52] U.S. Cl. ...................... 437/31; 437/24; 148/DIG. 10; 148/DIG. 11
[58] Field of Search ............... 437/31, 24; 148/DIG. 10, 148/DIG. 11

[56] References Cited

U.S. PATENT DOCUMENTS

| 5,284,783 | 2/1994 | Ishikawa et al. | 437/31 |
| 5,496,744 | 3/1996 | Ishimaru | 437/31 |

FOREIGN PATENT DOCUMENTS 0110668  1/1989  Japan.

Primary Examiner—John Niebling
Assistant Examiner—Long Pham
Attorney, Agent, or Firm—John T. Rehberg

[57] ABSTRACT

Indium doping is used to make bases of bipolar transistors with superior operational characteristics.

8 Claims, 2 Drawing Sheets

METHOD FOR MAKING BIPOLAR TRANSISTORS HAVING INDIUM DOPED BASE

TECHNICAL FIELD

This invention relates to methods for fabricating bipolar transistors and devices formed thereby.

BACKGROUND OF THE INVENTION

Bipolar transistors and bipolar integrated circuits are typically used in applications in which speed is paramount.

Several fabrication processes are utilized to form bipolar integrated circuits. By way of example, the following reference is illustrative of typical fabrication processes: BIC-MOS Technology and Applications, Second Edition, edited by A. R. Alvarez, Kluwer Academic Publishers, 1993. The above treatise is incorporated herein by reference.

Nonetheless, those concerned with the development of bipolar technology have continuously searched for methods for forming devices with higher speed and higher collector current with little or no penalty in Early voltage and punch-through.

SUMMARY OF THE INVENTION

Illustratively, the present invention includes forming a first n doped region in a semiconductor substrate, thereby forming a collector region; implanting indium ions into the n doped region, thereby forming a base region; then forming an emitter region in contact with the base region.

DETAILED DESCRIPTION

Figure 1:
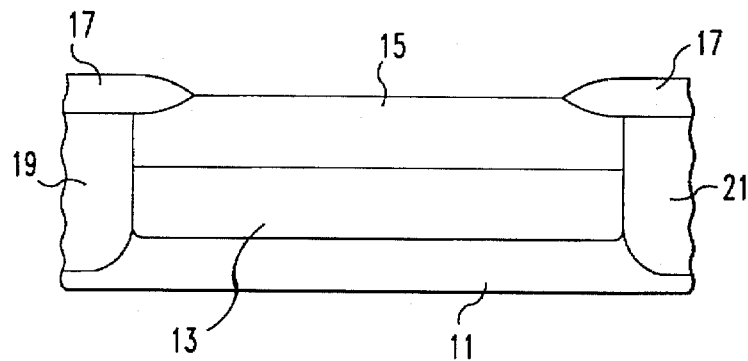
FIGS. 1–5 are cross sectional views of an illustrative embodiment of the present invention.

In FIG. 1, reference numeral 11 denotes a p type substrate. Reference numeral 17 denotes a field oxide; reference numerals 19 and 21 denote p wells. Reference numeral 13 denotes an n+ region; while reference numeral 15 denotes an n− epitaxial region. The structure depicted in FIG. 1 is a somewhat conventional structure serving as a starting point for many bipolar fabrication processes. Typically, the p wells are doped with boron. Region 13 is doped with arsenic or antimony to a concentration of $10^{19}$–$10^{21}$ cm$^{-3}$. Region 15 is doped with phosphorus or arsenic to a concentration of $10^{15}$–$10^{18}$ cm$^{-3}$.

Figure 2:
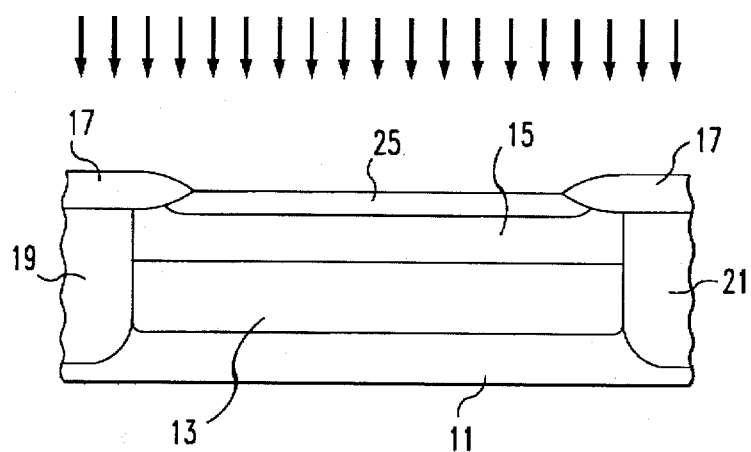

Turning to FIG. 2, an ion implantation with indium 23 at an energy of 20 Kev14 200 Kev and a dose of $10^{12}$ to $10^{15}$ cm$^{-2}$ is performed. The indium dopant forms base region 25. As will be explained later, formation of the base with the above-mentioned indium doping provides a transistor with high speed and narrow base. Furthermore, incomplete ionization of the indium dopant permits the formation of devices with high collector current with little or no penalty in Early voltage or base punch-through. Illustratively, the base region width is 150–1500 Å. It may also be desirable to dope the base with $BF_2$ or boron at doses between $10^{12}$ and $10^{14}$ cm$^{-2}$ and energies between 20 KeV and 100 KeV.

Figure 3:
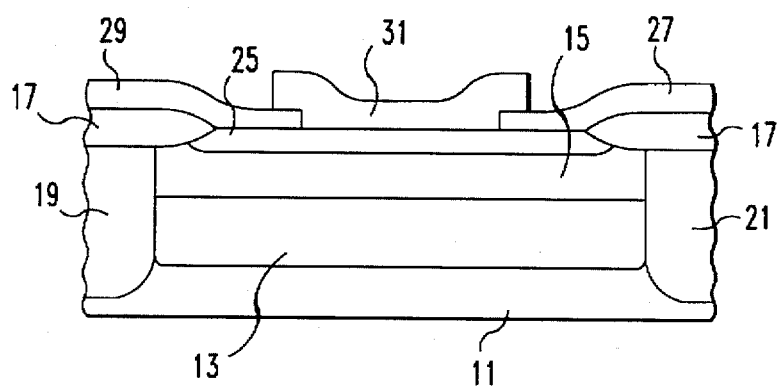

In FIG. 3, a blanket oxide layer has been formed and patterned, leaving oxide segments 27 and 29. Then a blanket layer of polysilicon is deposited to a thickness of 1000–3000 Å. The polysilicon is then patterned to form emitter contact 31. Next, the emitter contact 31 is implanted with arsenic or phosphorus, typically using energies between 50–100 Kev and doses of approximately $10^{16}$ cm$^{-2}$.

Figure 4:
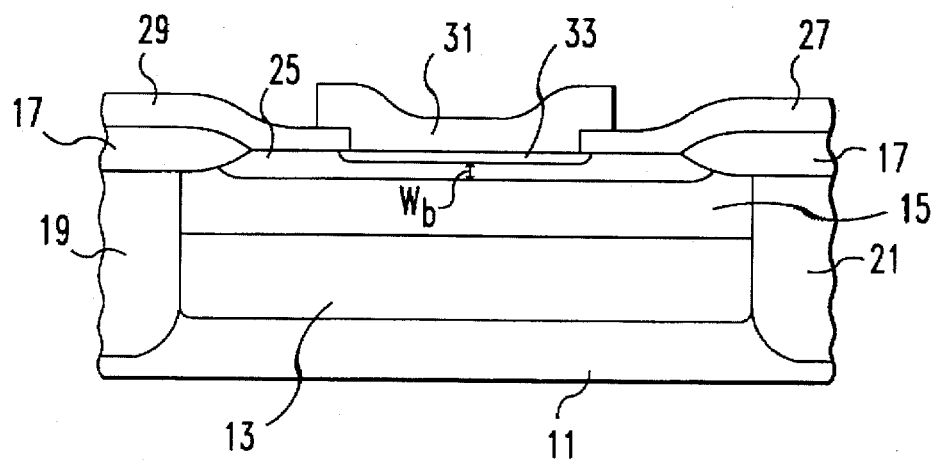

Turning to FIG. 4, a rapid thermal anneal (RTA) or furnace drive-in is performed. The arsenic or phosphorus dopant from polysilicon emitter contact 31 is driven out to form n+ region 33. Thus, there has been formed a bipolar transistor with emitter 33, base 25, and collector 15. The base width is indicated by $W_b$ in FIG. 4.

Figure 5:
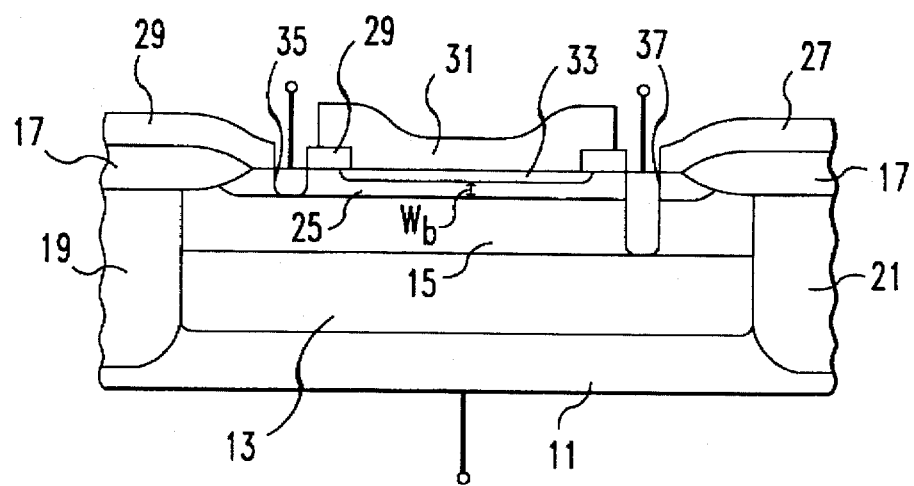

Turning to FIG. 5, dielectrics 29 and 27 may be patterned and ion implantations with boron and phosphorus (or arsenic) performed to create doped regions 35 and 37 respectively, which may serve as contacts to base and collector 25 and 15 respectively.

In the following, it is shown that for two bipolar transistors with identical emitter profiles and base profiles, the structure with the indium doped base will have a higher gain ($h_{fe}$) and collector current with no penalty in the Early voltage ($V_A$), compared with boron doped base. Furthermore, it will be shown that for two bipolar structures with identical collector currents ($I_c$) and $h_{fe}$, the structure that uses indium as a base dopant (as opposed to boron) will have a much larger Early voltage ($V_A$).

For a transistor with base width $W_B$ and base acceptor doping $N_B$, the Early voltage is $$V_A \approx \frac{qN_B W_B^2}{\epsilon_S} \quad (1)$$

The transistor collector current (Ic) is $$I_C \approx \frac{qAn_{ib}^2 D}{\int_0^{W_B} p\,dx} \cdot e^{\frac{qV_{BE}}{\kappa T}} \quad (2)$$

where q, A, Ni, D are constants, and $V_{BE}$ is the applied voltage. The integral $$\int_0^{W_B} p\,dx$$

is the Gummel number, where p is the hole concentration in the quasi-neutral base. Therefore, collector current can be increased by reducing the Gummel-number, that is by reducing the integrated hole concentration in the quasi-neutral base. When the base dopant is boron, which has an acceptor state 45 meV from the valence band, at typical operating temperatures all of these acceptor states are ionized and the hole concentration is equal to the doping, $p \approx N_B$.

In the case of Boron as base dopant, the collector current is inversely proportional to the base doping:

$$I_C \approx \frac{qAn_{ib}^2 D}{N_B \cdot W_B} e^{\frac{qV_{BE}}{\kappa T}} \quad (3)$$

The base current is given by (assuming a modern transistor where the base current is due to hole injection into the emitter), $$I_B \approx \frac{qAn_{ib}^2 D}{N_E \cdot X_E} e^{\frac{qV_{BE}}{\kappa T}} \quad (4)$$

where $X_E = W_E$ or $X_E = L_E$ depending whether the emitter width ($W_E$) is larger than the hole diffusion length ($L_E$). For our purposes it is kept constant. Bipolar gain is $$h_{fE} = \frac{I_C}{I_B} \approx \frac{N_E \cdot X_E}{N_B \cdot X_B} \quad (5)$$

for base dopant being Boron.

If indium is used as base dopant equation 2 still holds, $$I_C = \frac{qAn_{ib}^2 D}{\int_0^{W_B} p\, dx} \cdot e^{\frac{qV_{BE}}{\kappa T}} \quad (2)$$

But $p \neq N_B$; as a matter of fact $p \ll N_B$. This is because indium acceptor state is 156 meV above the valence band, and does not fully ionize at room temperature. This is described by the well known expression for the number of ionized acceptors (N$^-$) given by D. Antoniadis and J. Moskovitz, Journal of Applied Physics, Vol. 53, pp. 9214–9216, 1982, incorporated herein by reference.

$$N^- = \frac{N_B}{1 + \frac{p g_A}{N_V} e^{\frac{\Delta E_{IN}}{\kappa T}}} \quad (6)$$

In the case of quasi-neutral base $p = N^-$ ionized acceptor, then equation (6) reduces to a quadratic equation in p, and the solution is:

$$p = \frac{-\frac{N_v}{g e^{\frac{\Delta E_{IN}}{\kappa T}}} + \sqrt{\frac{N_v^2}{g^2 e^{\frac{2\Delta E_{IN}}{\kappa T}}} + \frac{4 N_B N_v}{g_A e^{\frac{\Delta E_{IN}}{\kappa T}}}}}{2} \quad (7)$$

where $N_v = 1.02 \times 10^{19}$ cm$^{-3}$, $g=4$, $\Delta E_{in} = 0.156$ eV, $N_B$=base doping. For $N_B = 5 \times 10^{18}$ cm$^{-3}$ (very heavy base doping) $p \approx 1.7 \times 10^{17}$ cm$^{-3}$, therefore, $p \ll N_B$. This will result in a much larger Ic for indium doped base as compared with boron doped base; see equations (2) and (3).

$$I_C(\text{indium}) \propto \frac{1}{P \cdot W_B} \gg \frac{1}{N_B W_B} \propto I_C(\text{boron}) \quad (8)$$

since $P \ll N_B$.

For transistor gain $h_{fe}$ we proceed as follows:

$$h_{fE} \overset{\Delta}{=} \frac{I_c}{I_B} \quad (9)$$

$$\frac{I_C(\text{indium})}{I_B} \gg \frac{I_C(\text{boron})}{I_B} \text{ with } I_B \text{ same for both.}$$

$$h_{fE}(\text{indium}) \gg h_{fE}(\text{boron}).$$

Now we proceed to show that these devices will have identical (nearly) Early voltages. Early voltage for boron and indium doped bases are identical since Early voltage depends on the reverse-biased characteristics of collector-base junction. When the junction is reverse biased the junction region is depleted of carriers (holes and electrons). Using equation (6)

$$N^- = \frac{N_B}{1 + \frac{P \cdot g_A}{N_V} e^{\frac{\Delta E_{IN}}{\kappa T}}} \text{ with } p = 0 \quad (10)$$

results in $N^- = N_B$. Then, $$V_A = \frac{q N^- W_B^2}{\epsilon_S} = \frac{g N_B W_B^2}{\epsilon_S}, \quad (11)$$

Thus, for a constant Early voltage $V_A$, we can increase $h_{fe}$ by using indium.

Now it will be shown two devices (one with indium, the other with boron base) with identical gains ($h_{fe}$) that the device with indium base has a much larger $V_A$. Let $W_B$ be constant and emitter profiles be identical.

$$h_{fe}(\text{boron}) = \frac{1}{N_B W_B} \equiv \frac{1}{P \cdot W_B} = h_{fe}(\text{indium}). \quad (12)$$

then $N_B(\text{boron}) \ll N_B(\text{indium})$. That is, to get the same gain, one can dope the indium base much higher. Then, $$V_A(\text{boron}) = \frac{q N_B(\text{boron}) W_B^2}{\epsilon_S} \ll \frac{q N_B(\text{indium}) W_B^2}{\epsilon_S}. \quad (13)$$

In this analysis, band gap narrowing in the base has been ignored.

In summary, using indium as the acceptor dopant for the npn-bipolar transistor p-base region, has the following advantages:

(1) Since indium diffuses much slower than boron (the conventional base dopant) it will be possible to fabricate transistors with narrow base widths ($W_B$) and hence much improved base transit time and $f_r$.

(2) Relative to boron, indium has a deeper acceptor level. This property of indium is utilized to obtain a reduced Gummel-number in the quasineutral base, while the base can not be punched-through since full ionization of indium acceptor states is achieved in depletion regions. This results in improved $h_{fe} \times V_A$ (gain-Early voltage product) over boron doped base structures.

The invention claimed is:

1. A method of forming a bipolar transistor, comprising:
   forming a first n doped region in a semiconductor substrate, thereby forming a collector region;
   implanting indium ions into said n doped region,
   implanting boron or BF$_2$ into said n doped region, thereby forming a base region; and
   forming an emitter region in contact with said base region.

2. The method of claim 1 in which said indium is implanted with an energy of 20 Kev–200 Kev.

3. The method of claim 1 in which said indium is implanted at a dose of $10^{12}$–$10^{15}$ cm$^{-2}$.

4. The method of claim 1 in which said emitter is formed by:
   forming a patterned oxide layer over said substrate, said patterned oxide layer having an opening exposing said base region;
   depositing polysilicon within said opening,
   doping said polysilicon with a dopant, and
   heating said doped polysilicon to drive said dopant out of said polysilicon and into said substrate, thereby forming an emitter.

5. The method of forming a bipolar transistor according to claim 1, wherein said boron or BF$_2$ is implanted at a dose of between $10^{12}$ and $10^{14}$ cm$^{-2}$.

6. The method of forming a bipolar transistor according to claim 1, wherein said boron or BF$_2$ is implanted at an energy of between 20 KeV and 100 KeV.

7. The method of forming a bipolar transistor according to claim 1, wherein said indium is implanted at a dose of $10^{12}$ to $10^{14}$ cm$^{-2}$ and said boron or BF$_2$ is implanted ar a dose of $10^{12}$ to $10^{14}$ cm$^{-2}$.

8. The method of forming a bipolar transistor according to claim 1, wherein said indium is implanted at an energy of 20 KeV to 200 KeV and said boron or BF$_2$ is implanted at an energy of 20 KeV to 100 KeV.

* * * * *